US008462518B2

(12) United States Patent
Marroquin et al.

(10) Patent No.: US 8,462,518 B2
(45) Date of Patent: Jun. 11, 2013

(54) POWER INVERTER DOCKING SYSTEM FOR PHOTOVOLTAIC MODULES

(75) Inventors: Marco A. Marroquin, Austin, TX (US); Stephen P. Wurmlinger, Scurry, TX (US); Thomas Paul Parker, Dallas, TX (US); Robert S. Balog, College Station, TX (US)

(73) Assignee: SolarBridge Technologies, Inc., Austin, TX (US)

( * ) Notice: Subject to any disclaimer, the term of this patent is extended or adjusted under 35 U.S.C. 154(b) by 754 days.

(21) Appl. No.: 12/609,742

(22) Filed: Oct. 30, 2009

(65) Prior Publication Data

US 2011/0083733 A1  Apr. 14, 2011

Related U.S. Application Data

(60) Provisional application No. 61/250,559, filed on Oct. 12, 2009.

(51) Int. Cl.
*H05K 7/02* (2006.01)

(52) U.S. Cl.
USPC ........ 361/807; 361/679.4; 361/809; 361/724; 361/733; 136/243; 136/244

(58) Field of Classification Search
USPC .......................................................... 361/807
See application file for complete search history.

(56) References Cited

U.S. PATENT DOCUMENTS

| 3,670,230 A | 6/1972 | Rooney et al. |
| 4,114,048 A | 9/1978 | Hull |
| 4,217,633 A | 8/1980 | Evans, Jr. ........................ 363/27 |
| 4,277,692 A | 7/1981 | Small |
| 4,287,465 A | 9/1981 | Godard et al. |
| 4,651,265 A | 3/1987 | Stacey et al. |
| 4,661,758 A | 4/1987 | Whittaker |
| 4,707,774 A | 11/1987 | Kajita |
| 4,709,318 A | 11/1987 | Gephart et al. |
| 4,719,550 A | 1/1988 | Powell et al. |

(Continued)

FOREIGN PATENT DOCUMENTS

| CA | 2353422 C | 3/2004 |
| CA | 2655007 A1 | 8/2010 |

(Continued)

OTHER PUBLICATIONS

H. Oldenkamp et al., AC modules: past, present and future, Workshop Installing the solar solution, Jan. 22-23, 1998, Hatfield, UK.

(Continued)

*Primary Examiner* — Anthony Q Edwards
(74) *Attorney, Agent, or Firm* — Barnes & Thornburg LLP

(57) ABSTRACT

An electronics module docking system includes docking member removably coupled to a photovoltaic module. The docking system includes a first connector port electrically coupled to one or more photovoltaic cells of the photovoltaic module. The photovoltaic module is selectively coupleable to the docking member. The docking system includes a housing to enclose an electronics module. The housing may include second connector port that is selectively engageable to the power electronics module. The power electronics module and the photovoltaic cells are electrically coupled to one another upon selective engagement of the connector ports. The inverter housing is receivable by and removably coupleable to the docking member allowing the inverter housing to be removably coupleable to the photovoltaic module.

24 Claims, 11 Drawing Sheets

U.S. PATENT DOCUMENTS

| | | | |
|---|---|---|---|
| 4,725,740 A | 2/1988 | Nakata | |
| 5,041,959 A | 8/1991 | Walker | |
| 5,148,043 A | 9/1992 | Hirata et al. | |
| 5,160,851 A | 11/1992 | McAndrews | |
| 5,191,519 A | 3/1993 | Kawakami | |
| 5,309,073 A | 5/1994 | Kaneko et al. | |
| 5,343,380 A | 8/1994 | Champlin | |
| 5,473,528 A | 12/1995 | Hirata | |
| 5,668,464 A | 9/1997 | Krein | |
| 5,684,385 A | 11/1997 | Guyonneau et al. | |
| 5,721,481 A | 2/1998 | Narita et al. | |
| 5,745,356 A | 4/1998 | Tassitino | |
| 5,796,182 A | 8/1998 | Martin | |
| 5,801,519 A | 9/1998 | Midya et al. | |
| 5,886,890 A | 3/1999 | Ishida et al. | 363/71 |
| 5,929,537 A | 7/1999 | Glennon | |
| 5,951,785 A * | 9/1999 | Uchihashi et al. | 136/251 |
| 5,978,236 A | 11/1999 | Faberman et al. | |
| 5,982,645 A | 11/1999 | Levran et al. | |
| 6,046,400 A | 4/2000 | Drummer | 136/244 |
| 6,046,402 A | 4/2000 | More | |
| 6,111,189 A | 8/2000 | Garvison et al. | 136/244 |
| 6,154,379 A | 11/2000 | Okita | |
| 6,157,168 A | 12/2000 | Malik | |
| 6,180,868 B1 | 1/2001 | Yoshino et al. | |
| 6,201,180 B1 | 3/2001 | Meyer et al. | 136/244 |
| 6,201,319 B1 | 3/2001 | Simonelli et al. | |
| 6,225,708 B1 | 5/2001 | Furukawa | |
| 6,268,559 B1 | 7/2001 | Yamawaki | |
| 6,285,572 B1 | 9/2001 | Onizuka et al. | 363/72 |
| 6,291,764 B1 | 9/2001 | Ishida et al. | 136/293 |
| 6,311,279 B1 | 10/2001 | Nguyen | |
| 6,356,471 B1 | 3/2002 | Fang | |
| 6,369,461 B1 | 4/2002 | Jungreis et al. | |
| 6,381,157 B2 | 4/2002 | Jensen | |
| 6,445,089 B1 | 9/2002 | Okui | |
| 6,462,507 B2 | 10/2002 | Fisher | |
| 6,489,755 B1 | 12/2002 | Boudreaux et al. | |
| 6,563,234 B2 | 5/2003 | Hasegawa et al. | |
| 6,593,521 B2 * | 7/2003 | Kobayashi | 136/244 |
| 6,605,881 B2 | 8/2003 | Takehara et al. | 307/86 |
| 6,614,132 B2 | 9/2003 | Hockney et al. | |
| 6,624,533 B1 | 9/2003 | Swanson | |
| 6,657,321 B2 | 12/2003 | Sinha | |
| 6,700,802 B2 | 3/2004 | Ulinski et al. | |
| 6,713,890 B2 | 3/2004 | Kondo et al. | 290/40 |
| 6,727,602 B2 | 4/2004 | Olson | |
| 6,750,391 B2 | 6/2004 | Bower et al. | 136/244 |
| 6,765,315 B2 | 7/2004 | Hammerstrom | |
| 6,770,984 B2 | 8/2004 | Pai | |
| 6,791,024 B2 | 9/2004 | Toyomura | 136/251 |
| 6,795,322 B2 | 9/2004 | Aihara et al. | |
| 6,838,611 B2 | 1/2005 | Kondo et al. | 136/244 |
| 6,847,196 B2 | 1/2005 | Garabandic | |
| 6,881,509 B2 | 4/2005 | Jungreis | |
| 6,882,063 B2 | 4/2005 | Droppo et al. | |
| 6,897,370 B2 | 5/2005 | Kondo et al. | 136/293 |
| 6,950,323 B2 | 9/2005 | Achleitner | |
| 7,031,176 B2 | 4/2006 | Kotsopoulos et al. | |
| 7,072,195 B2 | 7/2006 | Xu | |
| 7,091,707 B2 | 8/2006 | Cutler | |
| 7,193,872 B2 | 3/2007 | Siri | |
| 7,233,130 B1 | 6/2007 | Kay | |
| 7,289,341 B2 | 10/2007 | Hesterman | |
| 7,297,866 B2 | 11/2007 | Aschenbrenner | 136/246 |
| 7,319,313 B2 | 1/2008 | Dickerson et al. | |
| 7,324,361 B2 | 1/2008 | Siri | |
| 7,339,287 B2 | 3/2008 | Jepsen et al. | |
| 7,342,171 B2 | 3/2008 | Khouri et al. | 136/245 |
| 7,365,998 B2 | 4/2008 | Kumar | |
| 7,387,537 B1 | 6/2008 | Daily et al. | 439/620.22 |
| 7,388,348 B2 * | 6/2008 | Mattichak | 320/101 |
| 7,405,494 B2 | 7/2008 | Tassitino, Jr. et al. | |
| 7,420,354 B2 | 9/2008 | Cutler | |
| 7,432,691 B2 | 10/2008 | Cutler | |
| 7,463,500 B2 | 12/2008 | West | |
| 7,502,697 B2 | 3/2009 | Holmquist et al. | |
| 7,521,914 B2 | 4/2009 | Dickerson et al. | |
| 7,531,993 B2 | 5/2009 | Udrea et al. | |
| 7,551,460 B2 | 6/2009 | Lalithambika et al. | |
| 7,577,005 B2 | 8/2009 | Angerer et al. | |
| 7,592,789 B2 | 9/2009 | Jain | |
| 7,609,040 B1 | 10/2009 | Jain | |
| 7,626,834 B2 | 12/2009 | Chisenga et al. | |
| 7,638,899 B2 | 12/2009 | Tracy et al. | |
| 7,646,116 B2 | 1/2010 | Batarseh et al. | |
| 7,660,139 B2 | 2/2010 | Garabandic | |
| 7,667,610 B2 | 2/2010 | Thompson | |
| 7,710,752 B2 | 5/2010 | West | |
| 7,733,679 B2 | 6/2010 | Luger et al. | |
| 7,768,155 B2 | 8/2010 | Fornage | |
| 7,796,412 B2 | 9/2010 | Fornage | |
| RE41,965 E | 11/2010 | West | |
| 7,839,022 B2 | 11/2010 | Wolfs | |
| 7,855,906 B2 | 12/2010 | Klodowski et al. | |
| RE42,039 E | 1/2011 | West et al. | |
| 7,899,632 B2 | 3/2011 | Fornage et al. | |
| 7,916,505 B2 | 3/2011 | Fornage | |
| 2001/0043050 A1 | 11/2001 | Fisher | |
| 2002/0017822 A1 | 2/2002 | Umemura et al. | |
| 2002/0186020 A1 * | 12/2002 | Kondo et al. | 324/538 |
| 2002/0196026 A1 | 12/2002 | Kimura et al. | |
| 2005/0213272 A1 | 9/2005 | Kobayashi | |
| 2006/0067137 A1 | 3/2006 | Udrea | |
| 2006/0083039 A1 | 4/2006 | Oliveira | |
| 2007/0040539 A1 | 2/2007 | Cutler | |
| 2007/0040540 A1 | 2/2007 | Cutler | |
| 2007/0133241 A1 | 6/2007 | Mumtaz et al. | |
| 2007/0221267 A1 | 9/2007 | Fornage | |
| 2007/0295392 A1 | 12/2007 | Cinnamon | 136/251 |
| 2007/0295393 A1 | 12/2007 | Cinnamon | 136/251 |
| 2008/0006321 A1 | 1/2008 | Munch et al. | |
| 2008/0055952 A1 | 3/2008 | Chisenga et al. | |
| 2008/0078436 A1 | 4/2008 | Nachamkin et al. | |
| 2008/0106921 A1 | 5/2008 | Dickerson et al. | |
| 2008/0203397 A1 | 8/2008 | Amaratunga et al. | |
| 2008/0266922 A1 | 10/2008 | Mumtaz et al. | |
| 2008/0272279 A1 | 11/2008 | Thompson | |
| 2008/0283118 A1 | 11/2008 | Rotzoll et al. | 136/251 |
| 2008/0285317 A1 | 11/2008 | Rotzoll | |
| 2008/0304296 A1 | 12/2008 | NadimpalliRaju et al. | |
| 2009/0000654 A1 | 1/2009 | Rotzoll et al. | |
| 2009/0020151 A1 | 1/2009 | Fornage | |
| 2009/0066357 A1 | 3/2009 | Fornage | |
| 2009/0079383 A1 | 3/2009 | Fornage et al. | |
| 2009/0080226 A1 | 3/2009 | Fornage | |
| 2009/0084426 A1 | 4/2009 | Fornage et al. | |
| 2009/0086514 A1 | 4/2009 | Fornage et al. | |
| 2009/0097283 A1 | 4/2009 | Krein et al. | |
| 2009/0147554 A1 | 6/2009 | Adest et al. | |
| 2009/0184695 A1 | 7/2009 | Mocarski | |
| 2009/0200994 A1 | 8/2009 | Fornage | |
| 2009/0225574 A1 | 9/2009 | Fornage | |
| 2009/0230782 A1 | 9/2009 | Fornage | |
| 2009/0242272 A1 | 10/2009 | Little et al. | |
| 2009/0243587 A1 | 10/2009 | Fornage | |
| 2009/0244929 A1 | 10/2009 | Fornage | |
| 2009/0244939 A1 | 10/2009 | Fornage | |
| 2009/0244947 A1 | 10/2009 | Fornage | |
| 2009/0296348 A1 | 12/2009 | Russell et al. | |
| 2010/0085035 A1 | 4/2010 | Fornage | |
| 2010/0088052 A1 | 4/2010 | Yin et al. | |
| 2010/0091532 A1 | 4/2010 | Fornage | |
| 2010/0106438 A1 | 4/2010 | Fornage | |
| 2010/0139945 A1 | 6/2010 | Dargatz | |
| 2010/0175338 A1 | 7/2010 | Garcia Cors | |
| 2010/0176771 A1 | 7/2010 | Fieldhouse et al. | |
| 2010/0181830 A1 | 7/2010 | Fornage et al. | |
| 2010/0195357 A1 | 8/2010 | Fornage et al. | |
| 2010/0214808 A1 | 8/2010 | Rodriguez | |
| 2010/0222933 A1 | 9/2010 | Smith et al. | |
| 2010/0236612 A1 | 9/2010 | Khajehoddin et al. | |
| 2010/0263704 A1 | 10/2010 | Fornage et al. | |
| 2010/0283325 A1 | 11/2010 | Marcianesi et al. | |
| 2010/0309695 A1 | 12/2010 | Fornage | |
| 2010/0326490 A1 * | 12/2010 | Tagliareni et al. | 136/244 |
| 2011/0012429 A1 | 1/2011 | Fornage | |

| 2011/0019444 | A1 | 1/2011 | Dargatz et al. |
| 2011/0026281 | A1 | 2/2011 | Chapman et al. |
| 2011/0026282 | A1 | 2/2011 | Chapman et al. |
| 2011/0043160 | A1 | 2/2011 | Serban |
| 2011/0049990 | A1 | 3/2011 | Amaratunga et al. |
| 2011/0051820 | A1 | 3/2011 | Fornage |
| 2011/0130889 | A1 | 6/2011 | Khajehoddin et al. |

FOREIGN PATENT DOCUMENTS

| CA | 2693737 A1 | 8/2010 |
| DE | 20012131 U1 | 3/2001 |
| DE | 102004053942 A1 | 5/2006 |
| EP | 0793278 A2 | 9/1997 |
| EP | 1794799 A1 | 6/2007 |
| EP | 1803161 A1 | 7/2007 |
| EP | 1837985 A2 | 9/2007 |
| EP | 2043160 A2 | 4/2009 |
| GB | 2419968 A | 5/2006 |
| GB | 2421847 A | 7/2006 |
| GB | 2439648 A | 1/2008 |
| GB | 2434490 B | 4/2009 |
| GB | 2454389 A | 5/2009 |
| GB | 2455753 A | 6/2009 |
| GB | 2455755 A | 6/2009 |
| NL | 1021582 C2 | 4/2004 |
| NL | 1021591 C2 | 4/2004 |
| WO | WO 2004008619 A2 | 1/2004 |
| WO | WO 2004100348 A1 | 11/2004 |
| WO | WO 2004100348 A8 | 12/2005 |
| WO | WO 2006048688 A1 | 5/2006 |
| WO | WO 2007080429 A2 | 7/2007 |
| WO | WO 2009081205 A2 | 7/2009 |
| WO | WO 2009081205 A3 | 10/2009 |
| WO | WO 2009134756 A1 | 11/2009 |

OTHER PUBLICATIONS

C. Rodriguez et al., Long-Lifetime Power Inverter for Photovoltaic AC Modules, IEEE Transactions on Industrial Electronics, vol. 55, No. 7, Jul. 2008.

S. J. Strong et al., Development of Standardized, Low-Cost AC PV Systems, NREL/SR-520-23002, Jun. 1997.

S. J. Strong et al., Development of Standardized, Low-Cost AC PV Systems, NREL/SR-520-26084, Feb. 1999.

J. Hoffner et al., A PV Window Awning System on the University of Texas Houston Heal Science Center Using AC-Modules, 0-7803-5772-8-00, 2000.

M.C. Russell et al., Sunsine300 AC Module, Annual Report Jul. 25, 1995-Dec. 31, 1996, NREL/SR-520-23432, UC Category 1280.

G. Kern, Sunsine300: Manufacture of an AC Photovoltaic Module, Final Report, Phases I & II Jul. 25, 1995-Jun. 30, 1998, NREL/SR-520-26085.

W. Bower et al., Innovative PV Micro-Inverter Topology Eliminates Electrolytic Capacitors for Longer Lifetime, 1-4244-0016-3/06, 2006.

Ando et al., "Development of Single Phase UPS Having AC Chopper and Active Filter Ability," IEEE International Conference on Industrial Technology, 10.1109/ICIT.2006.372445, pp. 1498-1503, 2006.

Biel et al., "Sliding-Mode Control Design of a Boost-Buck Switching Converter for AC Signal Generation," vol. 51, issue 8, pp. 1539-1551, 2004.

Biel et al., "Sliding-Mode Control of a Single-Phase AC/DC/AC Converter," Proceedings of the 40th IEEE Conference on Decision and Control, vol. 1., pp. 903-907, Dec. 2001.

Bose et al., "Electrolytic Capacitor Elimination in Power Electronic System by High Frequency Filter," Conference Record of the 1991 IEEE Industry Applications Society Annual Meeting, vol. 1, pp. 869-878, 1991.

Bower et al., "Innovative PV Micro-inverter Topology Eliminates Electrolytic Capacitors for Longer Lifetime," Conference Record of the 2006 IEEE 4th World Conference on Photovoltaic Energy Conversion, vol. 2, pp. 2038-2041, May 2006.

Bower, "The AC PV Building Block-Ultimate Plug-n-Play That Brings Photovoltaics Directly to the Customer," Proceedings of the National Center for Photovoltaics (NCPV) and Solar Program Review Meeting, pp. 311-314, May 2003.

Brekken et al., "Utility-Connected Power Converter for Maximizing Power Transfer From a Photovoltaic Source While Drawing Ripple-Free Current," 2002 IEEE 33rd Annual Power Electronics Specialists Conference, vol. 3, pp. 1518-1522, 2002.

Brekken, "Utility-Connected Power Converter for Maximizing Power Transfer From a Photovoltaic Source,"Thesis Submitted to the Faculty of the Graduate School of the University of Minnesota, Jun. 2002, 56 pages.

Bush, "UK Solar Firm Discloses Novel Inverter Topology," ElectronicsWeekly.com. Apr. 2011, last accessed Aug. 30, 2011 at http://www.electronicsweekly.com/Articles/2011/04/26/50953/UK-solar-firm-discloses-novel-inverter-topology.htm.

Chang et al., "The Impact of Switching Strategies on Power Quality for Integral Cycle Controllers," IEEE Transactions on Power Delivery, vol. 18, No. 3, pp. 1073-1078, Jul. 2003.

Chisenga, "Development of a Low Power Photovoltaic Inverter for Connection to the Utility Grid," PhD Thesis, Fitzwilliam College, Cambridge, 173 pages, 2007.

Di Napoli et al., "Multiple-Input DC-DC Power Converter for Power-Flow Management in Hybrid Vehicles," Conference Rec. IEEE Industrial Applications Soc. Annual Meeting, pp. 1578-1585, 2002.

Edelmoser, "Improved 2kw Solar Inverter With Wide Input Voltage Range," IEEE 10th Mediterranean Conference, MEIeCon 2000, vol. 2, pp. 810-813, 2000.

Enphase Energy, "Application Note: Multi-Tenant Design Guidelines," rev. 1, 5 pages, 2008.

Enphase Energy, "Enphase Field Wiring Diagram—M190 & M210 Microinverters—240v, Single Phase," Drawing No. 144-00001, rev. 6, 1 page, 2009.

Enphase Energy, "Enphase Micro-Inverter Technical Data," Doc. No. 142-00004, rev. 2, 2 pages, 2008.

Esram et al., "Comparison of Photovoltaic Array Maximum Power Point Tracking Techniques," IEEE Transactions on Energy Conversion, vol. 22, No. 2, pp. 439-449, Jun. 2007.

Henze et al., "A Novel AC Module with High-Voltage Panels in CIS Technology," 23rd European Photovoltaic Solar Energy Conference, Valencia, Spain, ISBN 3-936338-24-8, 8 pages, Sep. 2008.

Hu et al., "Efficiency Improvement of Grid-tied Inverters at Low Input Power Using Pulse Skipping Control Strategy," Twenty-Fifth Annual IEEE Applied Power Electronics Conference and Exposition, pp. 627-633, Feb. 2010.

Hung et al., "Analysis and Implementation of a Delay-compensated Deadbeat Current Controller for Solar Inverters," IEEE Proceedings—Circuits, Devices and Systems, pp. 279-286, 2001.

Itoh et al., "Ripple Current Reduction of a Fuel Cell for a Single-Phase Isolated Converter using a DC Active Filter with a Center Tap," Twenty-Fourth Annual IEEE Applied Power Electronics Conference and Exposition, APEC '09, pp. 1813-1818, 2009.

Jantsch et al., "AC PV Module Inverters With Full Sine Wave Burst Operation Mode for Improved Efficiency of Grid Connected Systems at Low Irradiance," Proceedings of the 14th European Photovoltaic Solar Energy Conference, 5 pages, 1997.

Jeong et al., "An Improved Method for Anti-Islanding by Reactive Power Control," pp. 965-970, 2005.

Jung et al., "A Feedback Linearizing Control Scheme for a PWM Converter-Inverter Having a Very Small DC-Link Capacitor," IEEE Transactions on Industry Applications, vol. 35., issue 5, pp. 1124-1131, 1999.

Jung et al., "High-frequency DC Link Inverter for Grid-Connected Photovoltaic System," Conference Record of the Twenty-Ninth IEEE Photovoltaic Specialists Conference, pp. 1410-1413, 2002.

Kern, "SunSine300: Manufacture of an AC Photovoltaic Module, Final Report, Phases I & II, Jul. 25, 1995-Jun. 30, 1998," NREL/SR-520-26085, 1999, 32 pages.

Khajehoddin et al., "A Nonlinear Approach to Control Instantaneous Power for Single-phased Grid-connected Photovoltaic Systems," IEEE Energy Conversion Congress and Exposition (ECCE), pp. 2206-2212, 2009.

Khajehoddin et al., "A Novel Topology and Control Strategy for Maximum Power Point Trackers and Multi-string Grid-connected PV Inverters," Applied Power Electronics Conference, APEC08, pp. 173-178, 2008.

Khajehoddin et al., "A Robust Power Decoupler and Maximum Power Point Tracker Topology for a Grid-Connected Photovoltaic System," IEEE Power Electronics Specialists Conference, PESC08, pp. 66-69, 2008.

Kim et al., "New Control Scheme for AC-DC-AC Converter Without DC Link Electrolytic Capacitor," 24th Annual IEEE Power Electronics Specialists Conference, PESC '93 Record., pp. 300-306, 1993.

Kitano et al., "Power Sensor-less MPPT Control Scheme Utilizing Power Balance at DC Link—System Design to Ensure Stability and Response," The 27th Annual Conference of the IEEE Industrial Electronics Society, vol. 2, pp. 1309-1314, 2001.

Kjaer et al., "A Novel Single-Stage Inverter for the AC-module with Reduced Low-Frequency Ripple Penetration," EPE 2003, ISBN 90-75815-07-7, 10 pages, 2003.

Kjaer et al., "A Review of Single-phase Grid-connected Inverters for Photovoltaic Modules," IEEE Trans on Power Electronics, vol. 41, No. 5, pp. 1292-1306, 2005.

Kjaer et al., "Design Optimization of a Single Phase Inverter for Photovoltaic Applications," IEEE 34th Annual Power Electronics Specialist Conference, PESC '03, vol. 3, pp. 1183-1190, 2003.

Kjaer et al., "Power Inverter Topologies for Photovoltaic Modules—A Review," Conf. record of the 37th Industry Applications Conference, vol. 2, pp. 782-788, 2002.

Kjaer, "Design and Control of an Inverter for Photovoltaic Applications," PhD Thesis, Aalborg University Institute of Energy Technology, 236 pages, 2005.

Kjaer, "Selection of Topologies for the Photoenergy™ Project," Aalborg University Institute of Energy Technology, 37 pages, 2002.

Kotsopoulos et al., "A Predictive Control Scheme for DC Voltage and AC Current in Grid-Connected Photovoltaic Inverters with Minimum DC Link Capacitance," The 27th Annual Conference of the IEEE Industrial Electronics Society, vol. 3, pp. 1994-1999, 2001.

Kotsopoulos et al., "Predictive DC Voltage Control of Single-Phase PV Inverters with Small DC Link Capacitance," 2003 IEEE International Symposium on Industrial Electronics, vol. 2, pp. 793-797, 2003.

Kutkut, "PV Energy Conversion and System Integration," Florida Energy Systems Consortium, 2009, 24 pages.

Kwon et al., "High-efficiency Module-integrated Photovoltaic Power Conditioning System," IET Power Electronics, doi: 10.1049/iet-pel.2008.0023, 2008.

Lohner et al., "A New Panel-integratable Inverter Concept for Grid-Connected Photovoltaic Systems," IEEE ISIE '96, vol. 2, pp. 827-831, 1996.

Martins et al., "Analysis of Utility Interactive Photovoltaic Generation System Using a Single Power Static Inverter," Conference Record of the Twenty-Eighth IEEE Photovoltaic Specialists Conference, pp. 1719-1722, 2000.

Martins et al., "Interconnection of a Photovoltaic Panels Array to a Single-Phase Utility Line From a Static Conversion System," Proc. IEEE Power Electronics Specialists Conf., pp. 1207-1211, 2000.

Martins et al., "Usage of the Solar Energy from the Photovoltaic Panels for the Generation of Electrical Energy," The 21st International Telecommunication Energy Conference, 6 pages, 1999.

Matsui et al, "A New Maximum Photovoltaic Power Tracking Control Scheme Based on Power Equilibrium at DC Link," Conference Record of the 1999 IEEE Thirty-Fourth IAS Annual Meeting, vol. 2, pp. 804-809, 1999.

Meinhardt et al., "Miniaturised 'low profile' Module Integrated Converter for Photovoltaic Applications with Integrated Magnetic Components," IEEE APEC '99, vol. 1, pp. 305-311, 1999.

Meza et al., "Boost-Buck Inverter Variable Structure Control for Grid-Connected Photovoltaic Systems," IEEE International Symposium on Circuits and Systems, vol. 2, pp. 1318-1321, 2005.

Midya et al., "Dual Switched Mode Power Converter," 15th Annual Conference of IEEE Industrial Electronics Society, vol. 1, pp. 155-158, Mar. 1989.

Midya et al., "Sensorless Current Mode Control—An Observer-Based Technique for DC-DC Converters," IEEE Transactions on Power Electronics, vol. 16, No. 4, pp. 522-526, Jul. 2001.

Nikraz et al., "Digital Control of a Voltage Source Inverter in Photovoltaic Applications," 35th Annual IEEE Power Electronics Specialists Conference, pp. 3266-3271, 2004.

Oldenkamp et al., "AC Modules: Past, Present and Future, Workshop Installing the Solar Solution," Jan. 1998, Hatfield, UK, 6 pages.

Pajic et al., "Unity Power Factor Compensation for Burst Modulated Loads," IEEE Power Engineering Society General Meeting, vol. 2, pp. 1274-1277, 2003.

Ramos et al., "A Fixed-Frequency Quasi-Sliding Control Algorithm: Application to Power Inverters Design by Means of FPGA Implementation," IEEE Transactions on Power Electronics, vol. 18, No. 1, pp. 344-355, Jan. 2003.

Rodriguez et al., "Analytic Solution to the Photovoltaic Maximum Power Point Problem," IEEE Transactions on Circuits and Systems, vol. 54, No. 9, pp. 2054-2060, Sep. 2007.

Rodriguez et al., "Dynamic Stability of Grid-Connected Photovoltaic Systems," Power Engineering Society General Meeting, vol. 2, pp. 2193-2199, 2004.

Rodriguez et al., "Long-Lifetime Power Inverter for Photovoltaic AC Modules," IEEE Transaction on Industrial Electronics, vol. 55, No. 7, pp. 2593-2601, Jul. 2008.

Ropp et al., "Determining the Relative Effectiveness of Islanding Detection Methods Using Phase Criteria and Nondetection Zones," IEEE Transactions on Energy Conversion, vol. 15, No. 3, pp. 290-296, Sep. 2000.

Russell et al., "SunSine300 AC Module, Annual Report Jul. 25, 1995-Dec. 31, 1996," NREL/SR-520-23432, UC Category 1280, 1997, 31 pages.

Schmidt et al., "Control of an Optimized Converter for Modular Solar Power Generation," 20th International Conference on Industrial Electronics, Control and Instrumentation, vol. 1, pp. 479-484, 1994.

Schutten et al., "Characteristics of Load Resonant Converters Operated in a High-Power Factor Mode," IEEE, Trans. Power Electronics, vol. 7, No. 2, pp. 5-16, 1991.

Sen et al., "A New DC-to-AC Inverter With Dynamic Robust Performance," 1998 IEEE Region 10 International Conference on Global Connectivity in Energy, Computer, Communication and Control, vol. 2, pp. 387-390, 1998.

Shimizu et al., "Flyback-Type Single-Phase Utility Interactive Inverter with Power Pulsation Decoupling on the DC Input for an AC Photovoltaic Module System," IEEE, Trans. Power Electronics, vol. 21, No. 5, pp. 1264-1272, Sep. 2006.

Singh et al., "Comparison of PI, VSC and Energy Balance Controller for Single Phase Active Filter Control," 1998 IEEE Region 10 International Conference on Global Connectivity in Energy, Computer, Communication and Control, vol. 2, pp. 607-614, 1998.

Strong et al., "Development of Standardized, Low-Cost AC PV Systems—Phase I Annual Report," NREL/SR-520-23002, Jun. 1997, 18 pages.

Strong et al., "Development of Standardized, Low-Cost AC PV Systems—Final Technical Report," NREL/SR-520-26084, Feb. 1999, 27 pages.

Sung et al., "Novel Concept of a PV Power Generation System Adding the Function of Shunt Active Filter," 2002 Transmission and Distribution Conference and Exhibition: Asia Pacific, vol. 3, pp. 1658-1663, 2002.

Takahashi et al., "Development of Long Life Three Phase Uninterruptible Power Supply Using Flywheel Energy Storage Unit," Proc. Int'l Conf. Power Electronics, vol. 1, pp. 559-564, 1996.

Takahashi et al., "Electrolytic Capacitor-Less PWM Inverter", in Proceedings of the IPEC '90, Tokyo, Japan, pp. 131-138, Apr. 2-6, 1990.

Thomas et al., "Design and Performance of Active Power Filters," IEEE IAS Magazine, 9 pages, 1998.

Tian, "Solar-Based Single-Stage High-Efficiency Grid-Connected Inverter," Masters Thesis, University of Central Florida, Orlando, 83 pages, 2005.

Vezzini et al., "Potential for Optimisation of DC-DC Converters for Renewable Energy by use of High Bandgap Diodes," 35th Annual IEEE Power Electronics Specialists Conference, vol. 5, 3836-3842, 2004.

Wada et al., "Reduction Methods of Conducted EMI Noise on Parallel Operation for AC Module Inverters," 2007 IEEE Power Electronics Specialists Conference, pp. 3016-3021, Jun. 2007.

Wu et al., "A Single-Phase Inverter System for PV Power Injection and Active Power Filtering With Nonlinear Inductor Consideration," IEEE Transactions on Industry Applications, vol. 41, No. 4, pp. 1075-1083, 2005.

Wu, et al., "A 1φ 3W Grid-Connection PV Power Inverter with APF Based on Nonlinear Programming and FZPD Algorithm," Eighteenth Annual IEEE Applied Power Electronics Conference and Exposition, APEC '03, vol. 1, pp. 546-5552, 2003.

Wu, et al., "A 1φ 3W Grid-Connection PV Power Inverter with Partial Active Power Filter," IEEE Transactions on Aerospace and Electronic Systems, vol. 39, No. 2, pp. 635-646, Apr. 2003.

Wu, et al., "PV Power Injection and Active Power Filtering With Amplitude-Clamping and Amplitude-Scaling Algorithms," IEEE Trans. on Industry Applications, vol. 43, No. 3, pp. 731-741, 2007.

Xue et al., "Topologies of Single-Phase Inverters for Small Distributed Power Generators: An Overview," IEEE Transactions on Power Electronics, vol. 19, No. 5, pp. 1305-1314, 2004.

International Search Report and Written Opinion for PCT/US2010/052057 dated May 12, 2011, 8 pages.

* cited by examiner

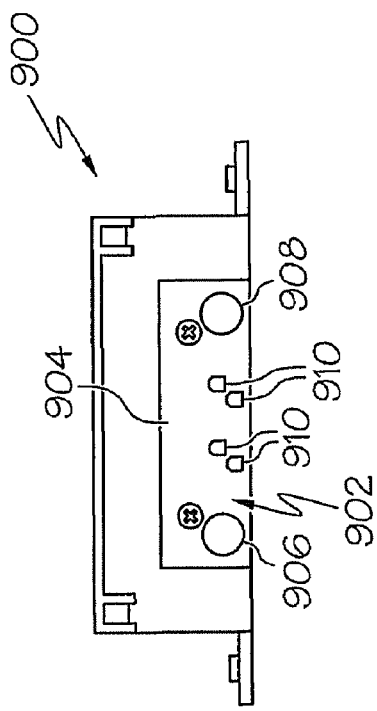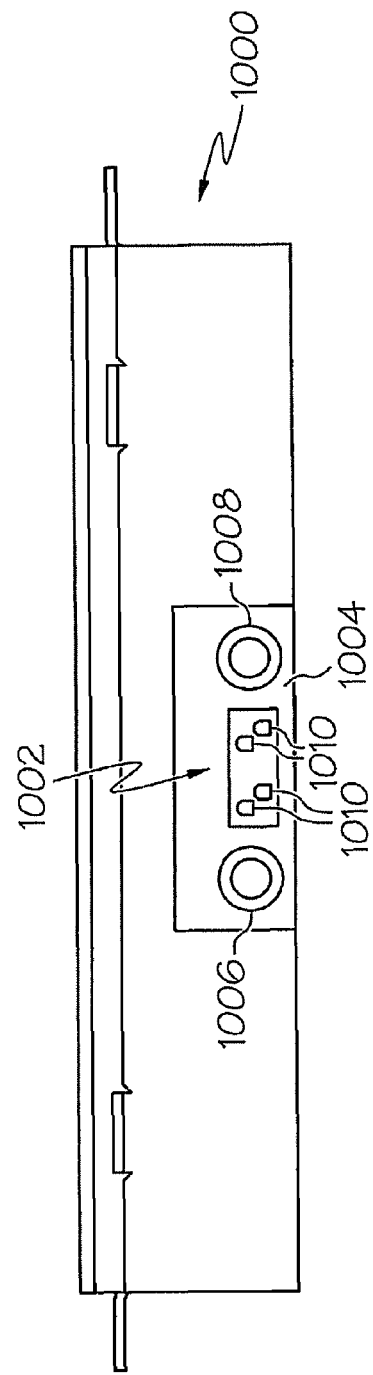

US 8,462,518 B2

POWER INVERTER DOCKING SYSTEM FOR PHOTOVOLTAIC MODULES

PRIORITY CLAIM

This application claims the benefit of priority from U.S. Provisional Patent Application Ser. No. 61/250,559 filed on Oct. 12, 2009, which is incorporated by reference herein in its entirety.

BACKGROUND OF THE INVENTION

1. Technical Field

This invention relates to power electronic docking systems, and more specifically to power inverter docking systems for photovoltaic modules.

2. Related Art

Typical photovoltaic (PV) modules may generate direct current (DC) power based on received solar energy. PV modules may include a plurality of PV cells electrically coupled to one another allowing the PV cells to contribute to a combined output power for a PV module. In particular applications, the DC power generated by a photovoltaic module may be converted to AC power through the use of a power inverter. The power inverter may be electrically coupled to an output of the PV module. Typically, intervening wiring may be used between the PV module and the power inverter. The power inverter may be directly connected to wires included in the intervening wiring. The power inverter may be located physically apart from the PV module, with only the intervening wiring and associated hardware physically coupling the PV module to the power inverter.

SUMMARY

According to one aspect of the disclosure, a power inverter docking system may be used to removably couple a power inverter to a photovoltaic (PV) module. The docking system may include a docking member that may be removably coupled to the PV module. The PV module may include one or more connectors electrically coupled to one or more PV cells of the PV module. The docking system may include a junction box having a PV connector port. The junction box may enclose an electrical coupling of the PV connector port and the connectors of the PV module. The junction box may be removably coupled to the docking member.

The docking system may also include an inverter housing to enclose a power inverter. The inverter housing may include an inverter housing connector port that may be electrically coupled to the power inverter. The inverter housing may selectively engage the junction box to form a connection between the inverter housing connector port and the PV connector port. The inverter housing may be removably coupled to the docking member to secure the inverter housing with respect to the PV module. The power inverter may convert direct current (DC) power generated by the PV module to alternating current (AC) power for various AC power applications.

According to another aspect of the disclosure, a method of assembling a power inverter docking system of a PV module may be implemented. The method may include removably coupling a docking member to the PV module. The method may further include electrically coupling a PV connector port to the PV module. The method may further include removably coupling a junction box including the PV connector port to the docking member. The method may further include removably coupling the PV connector port to the docking member. The method may further include electrically coupling an inverter housing connector port electrically coupled to a power inverter to the PV connector port. The method may further include removably coupling an inverter housing that encloses the power inverter to the docking member.

BRIEF DESCRIPTION OF THE DRAWINGS

The disclosure may be better understood with reference to the following drawings and description. The components in the figures are not necessarily to scale, emphasis instead being placed upon illustrating the principles of the invention. Moreover, in the figures, like referenced numerals designate corresponding parts throughout the different views:

FIG. 9 is an elevation view of an alternative example junction box.

FIG. 10 is an elevation view of an alternative example inverter housing.

DETAILED DESCRIPTION OF THE DRAWINGS

A docking system may be implemented for a photovoltaic module. The docking system may include docking member removably coupled to or integrally formed with a photovoltaic module. The docking system may also include a photovoltaic connector port electrically coupled to photovoltaic cells of the photovoltaic module. The photovoltaic module may be selectively coupled to the docking member. The docking system may also include a housing to enclose a power electronics module, such as a power inverter or converter. The housing may include an inverter housing connector port that is selectively engageable to the power electronics module. The power electronics module and the photovoltaic cells may be electrically coupled to one another upon selective engagement of the connector ports. The inverter housing may be received by and removably coupled to the docking member allowing the inverter housing to be removably coupled to the photovoltaic module.

Figure 1:
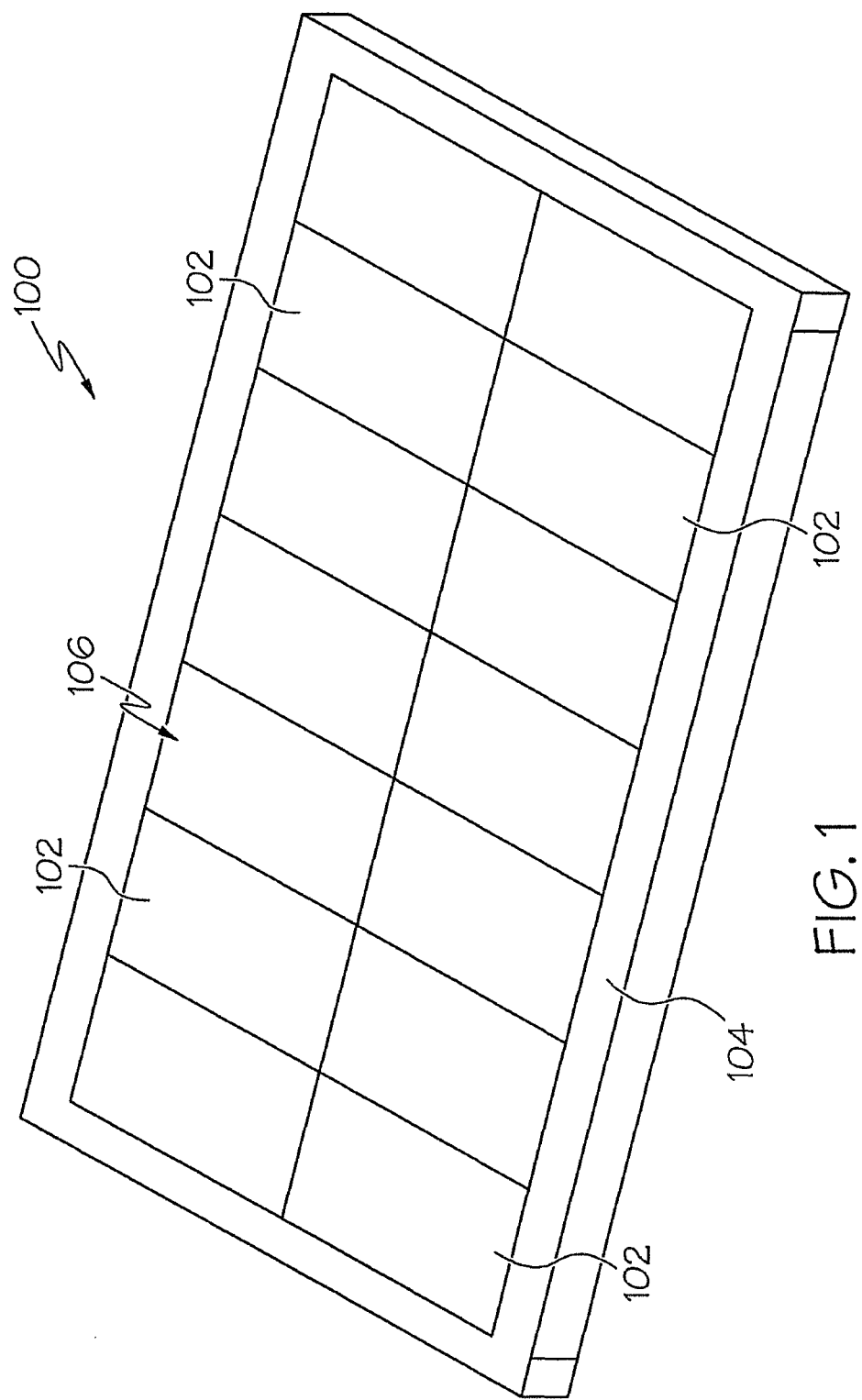
FIG. 1 is perspective view of an example photovoltaic (PV) module.

FIG. 1 is a perspective view of a photovoltaic module (PV) module 100. The PV module 100 may include a plurality of PV cells 102 disposed within a frame 104 of the PV module 100. The PV cells 102 may be electrically coupled in various configurations, such as sub-groups of PV cells 102 for example. The PV cells 102 may be configured to be exposed along a top surface 106 of the PV module 100 allowing the PV cells 102 to receive solar energy and convert the solar energy into electric power. The electric power produced by the PV cells 102 is direct-current (DC) based. In one example, the DC power from the PV cells 102 may be converted to alternating current (AC) power for use in AC power applications such as distribution portions of utility power grids.

Figure 2:
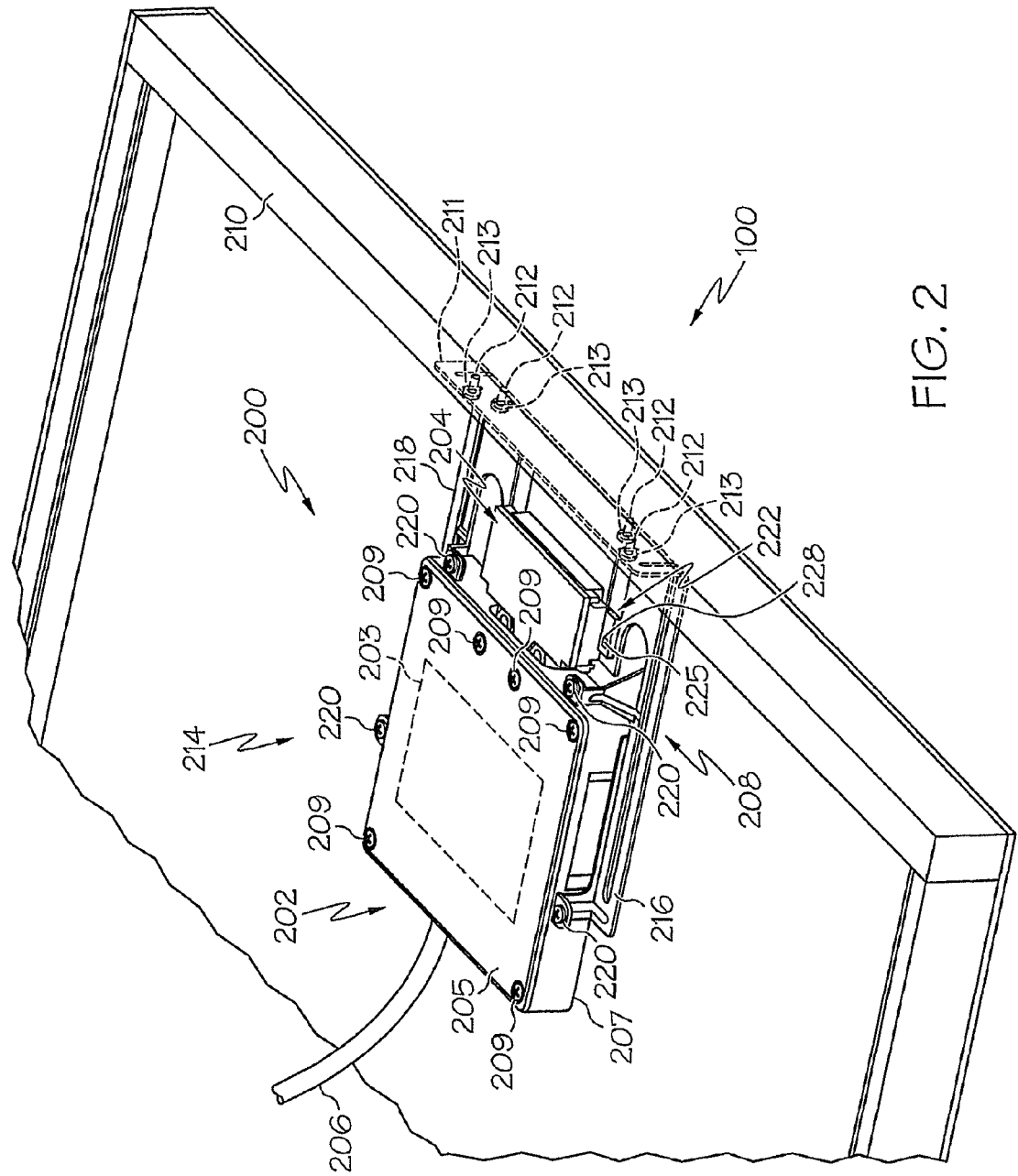
FIG. 2 is a perspective view of a PV module including an example power inverter docking system.

FIG. 2 is a perspective view of an underside of the photovoltaic (PV) module 100. A docking system 200 may include an inverter housing 202 removably coupled to the PV module 100. The inverter housing 202 may enclose a power inverter 203, conceptually represented in phantom in FIG. 2. In one example, the inverter housing 202 may be formed of an inverter housing cover 205 and an inverter housing enclosure 207 removably coupled to one another by a plurality of fasteners 209. In FIG. 2, the fasteners 209 may be threaded fasteners such as screws or bolts. The power inverter 203 may be electrically coupled to the PV cells 102 of the PV module 100. Various topologies may be used for the power inverter 203 such as a DC link inverter, AC link inverter, transformerless inverter, or any other suitable inverter topology. The power inverter 203 may provide a single-phase or a three-phase output. The inverter 203 topology may be constructed with multiple power stages, one of which may be an active filter converter. In alternative examples, the inverter housing 202 may be used to enclose one or more power inverters 203 or other power converter modules, such as DC-DC power converters, that may be electrically coupled to the PV module 100 for various applications. In other examples, one or more power converters may be electrically coupled to the PV module 100 and the power inverter 203.

A junction box 204 may provide electrical access to the PV cells 102 of the PV module 100 to the power inverter 203. In FIG. 2, the junction box 204 may be electrically coupled to the power inverter 203 enclosed within the inverter housing 202, allowing DC power generated by the PV module 100 to be converted to AC power and transmitted through a plurality of electrical conductors (FIG. 7) electrically coupled to the power inverter 203. The conductors may be disposed within an electrical cable 206. In one example, the junction box 204 may be formed of a non-electrically-conductive material such as plastic, resin, or a composite material, for example. In other examples, the junction box 204 may be formed of an electrically-conductive material.

A docking member 208 may be secured to the PV module 100. In FIG. 2, the docking member 208 may include a bracket 211 that may be removably coupled to a rail 210 of the PV module 100 through a plurality of fasteners 212. The rail 210 may be part of the frame 104. The bracket 211 may include a plurality of openings 213 to receive the fasteners 212. In FIG. 2, the fasteners 212 are illustrated as threaded fasteners, such as screws or bolts. However, various other fasteners, such as adhesives, clips, or other suitable coupling mechanisms may be used to removably couple the docking member 208 to the PV module 100. The docking member 208 may also be permanently or removably fastened to a surface 214 of the PV module 100 through the use of various suitable fastening manners such as fasteners, adhesives, or soldering, for example. In alternative examples, the docking member 208 may be secured to the PV module 100 in a manner other than that shown in FIG. 2. For example, the docking member 208 may be configured to be secured to the PV module 100 without being secured to both the rail 210 and the surface 214 of the PV module. In other examples, the docking member 208 may be integrally formed with the PV module 100, such as with the surface 214.

The docking member 208 may be removably coupled to the inverter housing 202 and the junction box 204. The docking member 208 may include a first rail 216 and a second rail 218.

The inverter housing 202 may be selectively received by the docking member 208 and the inverter housing 202 may be disposed between the rails 216, 218. The inverter housing 202 may be removably coupled to the docking member 208 through fasteners 220. Removable coupling allows the inverter housing 202 to be removed from the docking system 200 allowing repair, replacement, etc., of the inverter housing 202. In FIG. 2, the fasteners 220 may be captive threaded fasteners, such as captive screws or bolts. The fasteners 220 may also be any other suitable fasteners, such as clips, for example, allowing coupling. The docking member 208 may also include a first junction box slot 222 and a second junction box slot 224 (FIG. 3) allowing the junction box 204 to be removably coupled to the docking member 208. The junction box 204 may include a first tab 225 (FIG. 3) and a second tab 227 (FIG. 5) that may disposed through a first opening 228 and a second opening 230 (FIG. 3) of the slots 222, 224, respectively.

The inverter housing 202 and docking member 208 may be formed of an electrically conductive material, such as a metal. The electrically-conductive material may assist with grounding of the inverter housing 202, which is in contact with the docking member 208. The docking member 208 may be in contact with the surface 214 of the PV module 100, which may also be formed of an electrically conductive material. A chain of contact such as this may provide grounding for the inverter housing 202. A grounding conductor 712 (see FIG. 7) may also be provided to the inverter housing module 202 included in the cable 206 or external to the cable 206. The grounding cable may terminate within the inverter housing 202, which may also provide grounding to the docking member 208.

Figure 3:
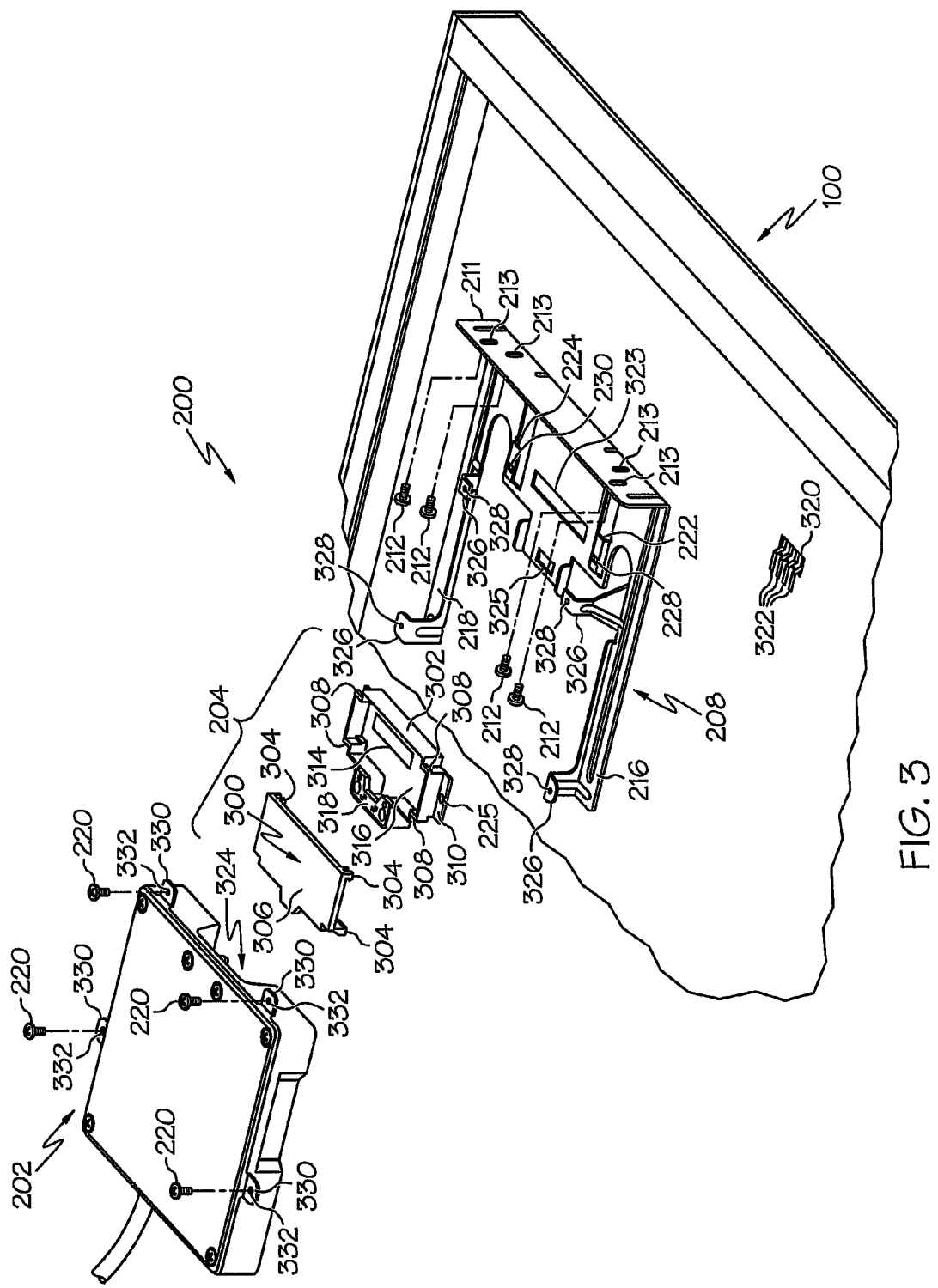
FIG. 3 is an exploded perspective view of FIG. 2.

FIG. 3 shows an exploded view of one example of the docking system 200 and PV module 100. The junction box 204 may include a cover 300 and an enclosure 302. The cover 300 may be removably coupled to the enclosure 302. The cover 300 of the junction box 204 may include a plurality of clip arms 304. Each clip arm 304 may extend from a body 306 of the cover 300. Each clip arm 304 may correspond to one of a plurality of cover receivers 308. In one example, each cover receiver 308 may be a ridge formed in the enclosure 302 for engagement with a corresponding clip arm 304. The cover 300 may be pressed onto the enclosure 302 causing each clip arm 304 to engage one of the cover receivers 308, such as being forced around each corresponding cover receiver 308 biasing each clip arm 304 from an initial respective resting position shown in FIG. 3. Each clip arm 304 may be resilient allowing each clip arm 304 to attempt to return to the initial resting position causing the clip arms 304 to engage the corresponding cover receiver 308 to removably couple the cover 300 to the enclosure 302, as shown in FIG. 2. Other suitable manners of removably coupling the cover 300 to the enclosure 302 may be implemented. In alternative examples, the cover 300 may be coupled to the enclosure 302 through a hinge, allowing the cover 300 to pivot between an open and closed position allowing internal access to the enclosure 302.

Figure 5:
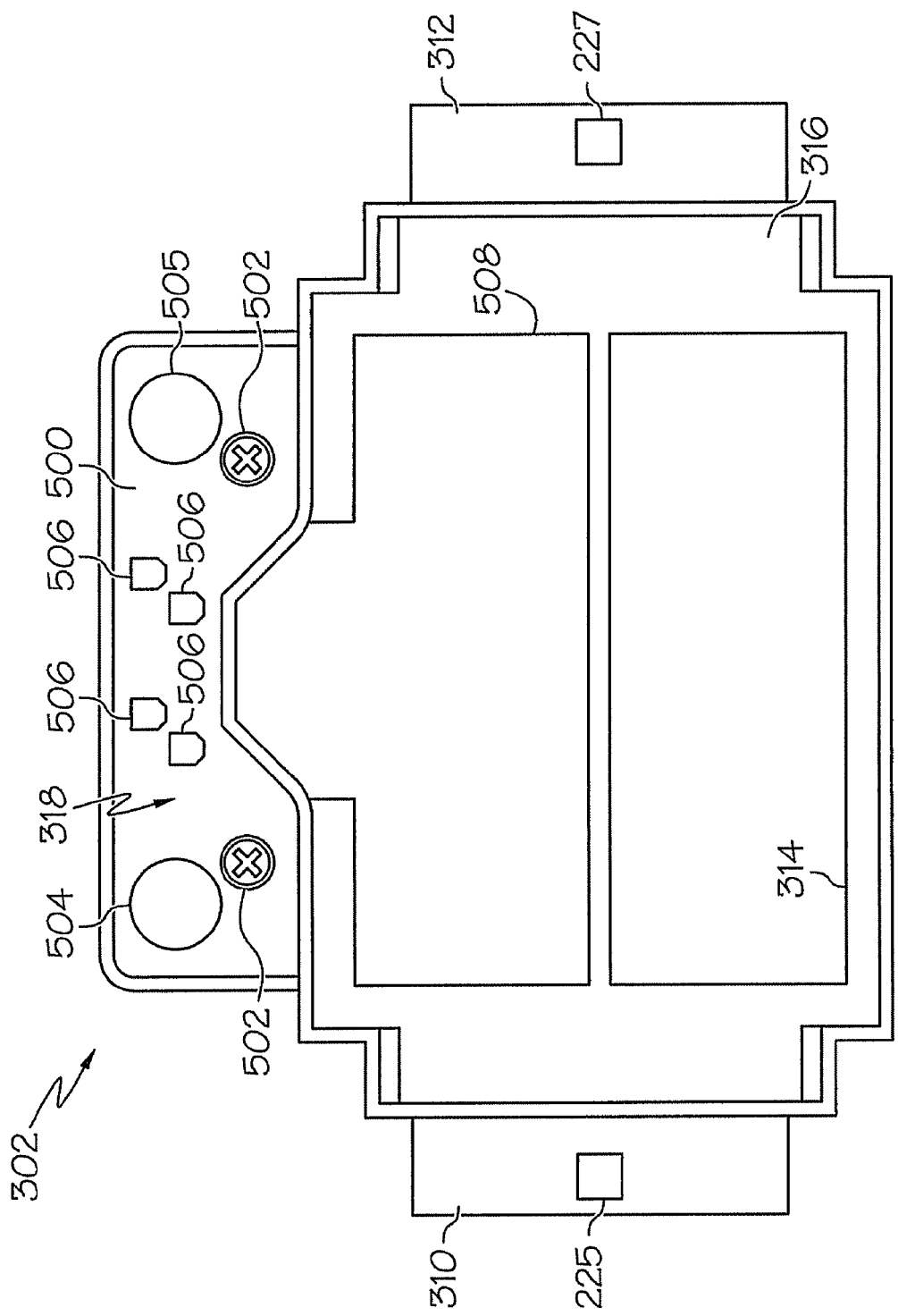
FIG. 5 is a plan view of an example junction box of the power inverter docking system of FIG. 2.

The enclosure 302 may include a first docking projection 310 and a second docking projection 312 (FIG. 5). Each docking projection 310, 312 may slide within a corresponding slot 222, 224 of the docking member 208. The openings 228, 230 may each receive the respective tab 225, 227 on each of the projections 310, 312. Receipt of each tab 225, 227 may secure the enclosure 302 of the junction box 204 into place with respect to the docking member 208. In the example shown in FIG. 3, the projections 310, 312 may be received by slots 222, 224, respectively, in a plane substantially parallel to the surface 214. The tabs 225, 227 may be received by the openings 228, 230, respectively, in a plane substantially perpendicular to the surface 214.

The enclosure 302 may include an enclosure access opening 314, such as a slot, disposed through a surface 316 of the enclosure 302. The enclosure 302 may also include a PV connector port 318. As discussed later, the enclosure 302 may be positioned to align the enclosure access opening 314 with a PV module opening 320, such as a slot. The PV module opening 320 may be disposed in the surface 214 and allow access to connectors 322 of the PV module 100. In one example, the docking member 208 may include a PV access opening 323, such as a slot, that may be aligned with the enclosure access opening 314 and the PV module opening 320. Alignment of the openings 314, 320, and 323 allows access to the connectors 322 for electrically coupling to the PV connector port 318 of junction box 204. In one example, the connectors 322 may be ribbon connectors electrically connected to the PV cells 102 of the PV module 100. However, other connectors, such as wires, may be implemented in the PV module 100 allowing electrical interfacing with the PV cells 102. In one example, the docking member 208 may include a junction box access opening 325 allowing for further internal access to the junction box 204

The PV connector port 318 may be removably coupled to an inverter housing connector port 324 of the inverter housing 202. In the example of FIG. 3, the inverter housing connector port 318 may be selectively engaged and disengaged with the PV connector port 324 along a plane substantially parallel to the surface 214. The inverter housing connector port 324 may be electrically coupled with the power inverter 203. In other examples, the inverter housing connector port 324 may be included with the power inverter 203.

The engagement of the connector ports 318, 324 allows power generated by the PV module 100 to be received by the power inverter 203. The docking member 208 may include a plurality of docking arms 326, each having a respective opening 328. The inverter housing 202 may include a plurality of docking tabs 330 extending outwardly from the inverter housing 202. In FIG. 3, the docking tabs 330 the docking tabs extend outwardly from the inverter housing cover 205 of the inverter housing 202. However, in other examples, some or all of the docking tabs 330 may extend from the inverter housing enclosure 207. Each docking tab 330 may include a respective opening 332. The docking arms 326 and docking tabs 330 may be positioned such that the openings 328 of each docking arm 326 and the openings 332 of each docking tab 330 align when the connector ports 318, 324 are coupled to one another. Upon alignment of the openings 328, 332, the fasteners 220 may be disposed through the aligned openings 328, 332 to secure the inverter housing 202 to the docking member 208. In one example, the rails 216, 218 of the docking member 208 may assist in the physical alignment of the inverter housing connector port 324 with the PV connector port 318.

Figure 4:
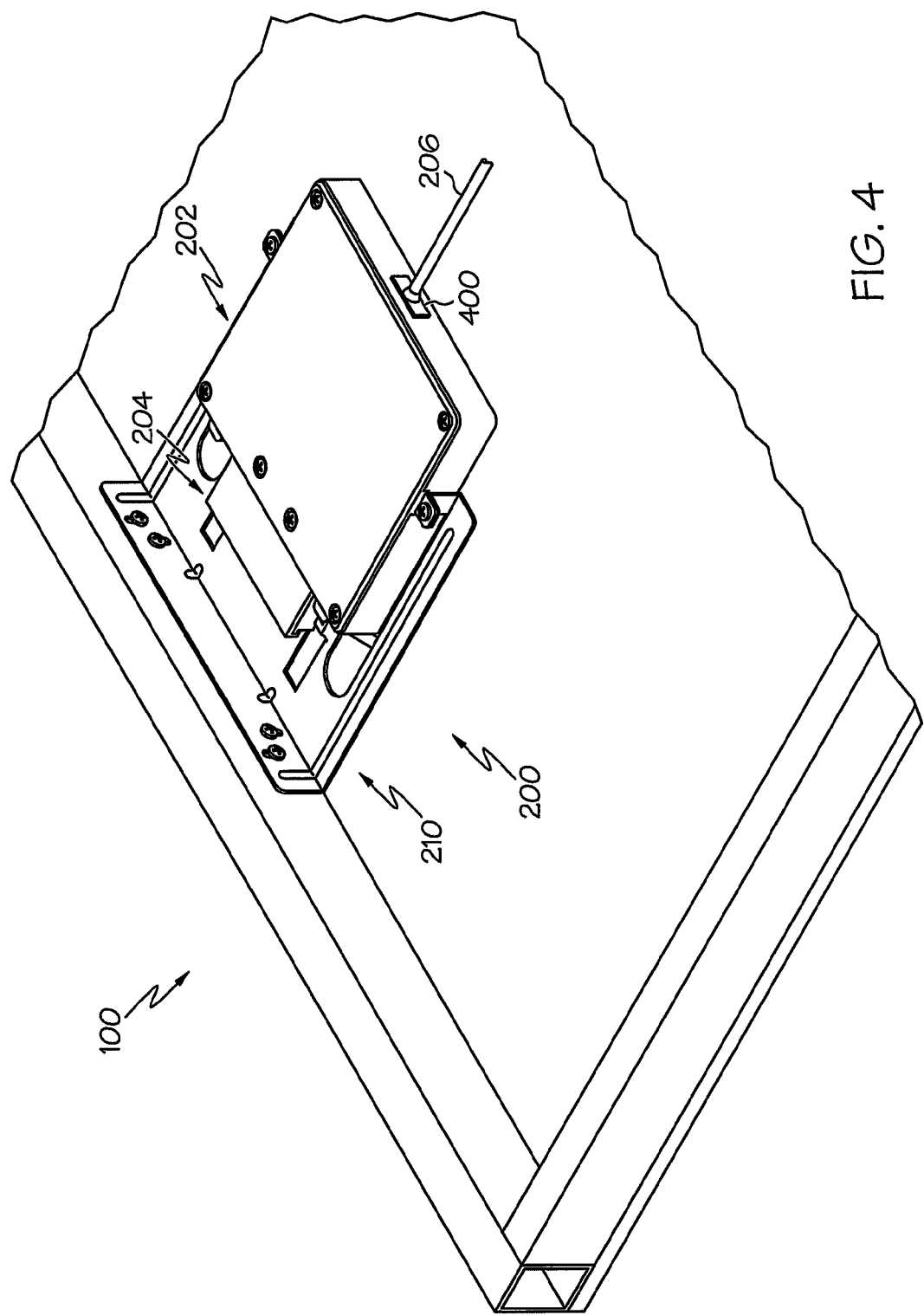
FIG. 4 is a different perspective view of the PV module including the example power inverter docking system of FIG. 2.

FIG. 4 is another perspective view of the docking system 200 and the PV module 100. The inverter housing 202 may include a plate 400 coupled to the inverter housing enclosure 207 of the inverter housing 202 to which the cable 206 is coupled.

FIG. 5 is a plan view of an example of the enclosure 302. The plan view illustrates an example placement and configuration of the docking projections 310, 312. The tabs 225, 227 are disposed along the projections 310, 312, respectively. The tabs 225, 227 may be separately coupled to the projections, 310, 312, respectively, or may be integrally formed thereon.

The PV connector port 318 may include a junction box connector plate 500 coupled to the enclosure 302 through one or more fasteners 502, such as screws, bolts, rivets, or other suitable fastener for removable or permanent coupling. The connector plate 500 may include a first guide post cavity 504 and second guide post cavity 505 formed within the connector plate 500. The guide post cavities 504, 505 may receive guide posts 700, 702 (FIG. 7) from the inverter housing connector port 324. The PV connector port 318 may also include a plurality of sockets 506. The sockets 506 may receive connector pins 704 (FIG. 7) from the inverter housing connector port 324. Receipt of the connector pins 704 may result in electrical coupling between the power inverter 203 and the PV module 100 as described with regard to FIGS. 2 and 3. The sockets 506 may be electrically coupled to a printed wiring board (PWB) 508. The PWB 508 may have a portion overlapping the PV connector port 318. The PWB 508 may be directly coupled to the sockets 506 or through intervening conductors (not shown). The PWB 508 may be electrically connected with the connectors 322 of the PV module 100 and may include conductors 800 (see FIG. 8) to electrically couple the connectors 322 to the sockets 506 on the PWB 508.

Figure 6:
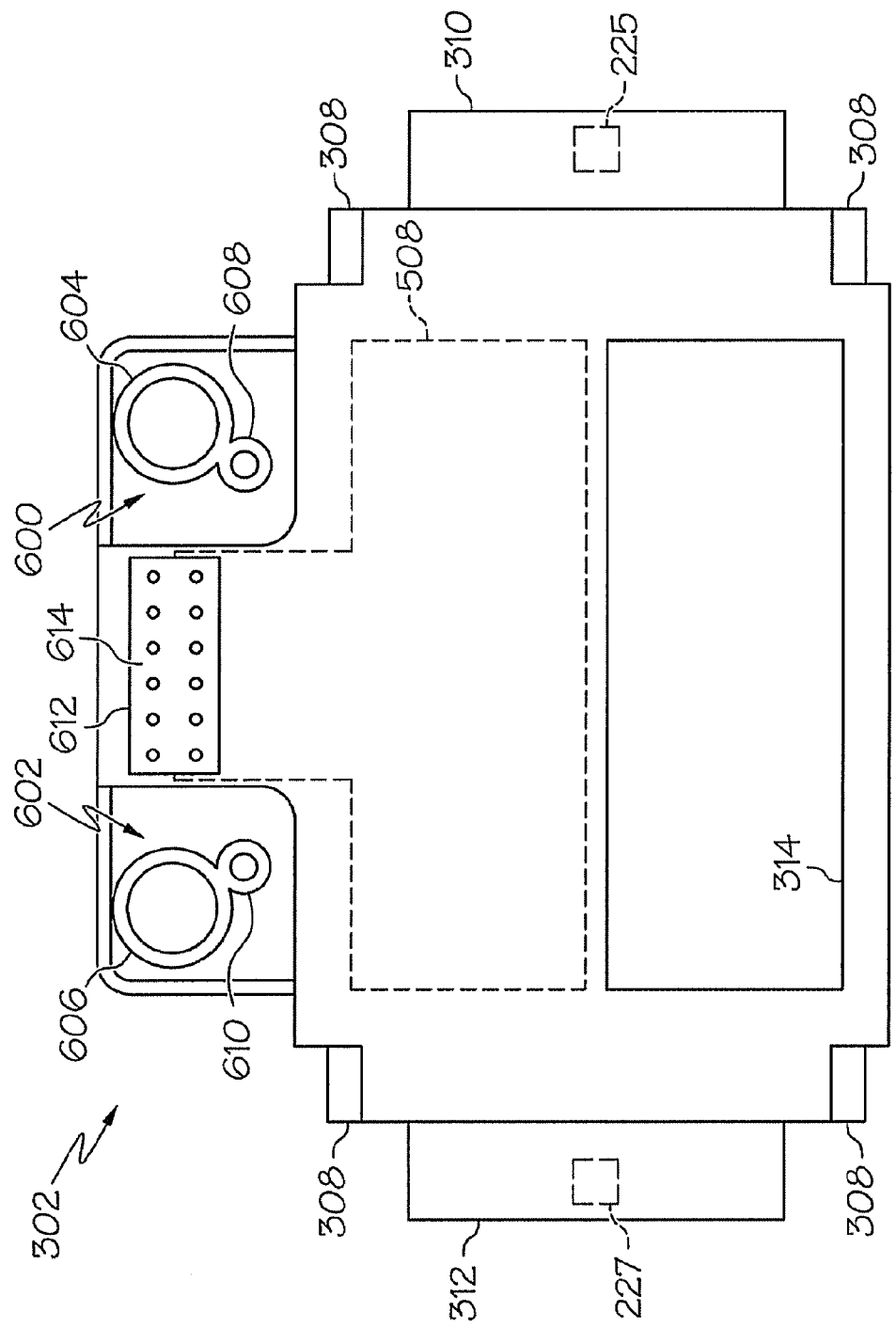
FIG. 6 is another plan view of the example junction box of FIG. 5.

FIG. 6 is a plan view of the enclosure 302 from an opposite view as that shown in FIG. 5. The plan view of FIG. 6 illustrates cavities 600, 602 formed by the enclosure 302. Disposed in each cavity 600, 602 are enclosure receptacles 604, 606, respectively, formed in the enclosure 302 to receive the portion of the connector plate 500 forming the guide post cavities 504, 505. Also disposed in each cavity 600, 602 is a fastener receptacle 608, 610, respectively, that may be formed in the enclosure 302 to receive the fastener 502, respectively, to couple the connector plate 500 to the enclosure 302. The enclosure 302 may also include an opening 612 allowing access to a socket connector board 614.

Figure 7:
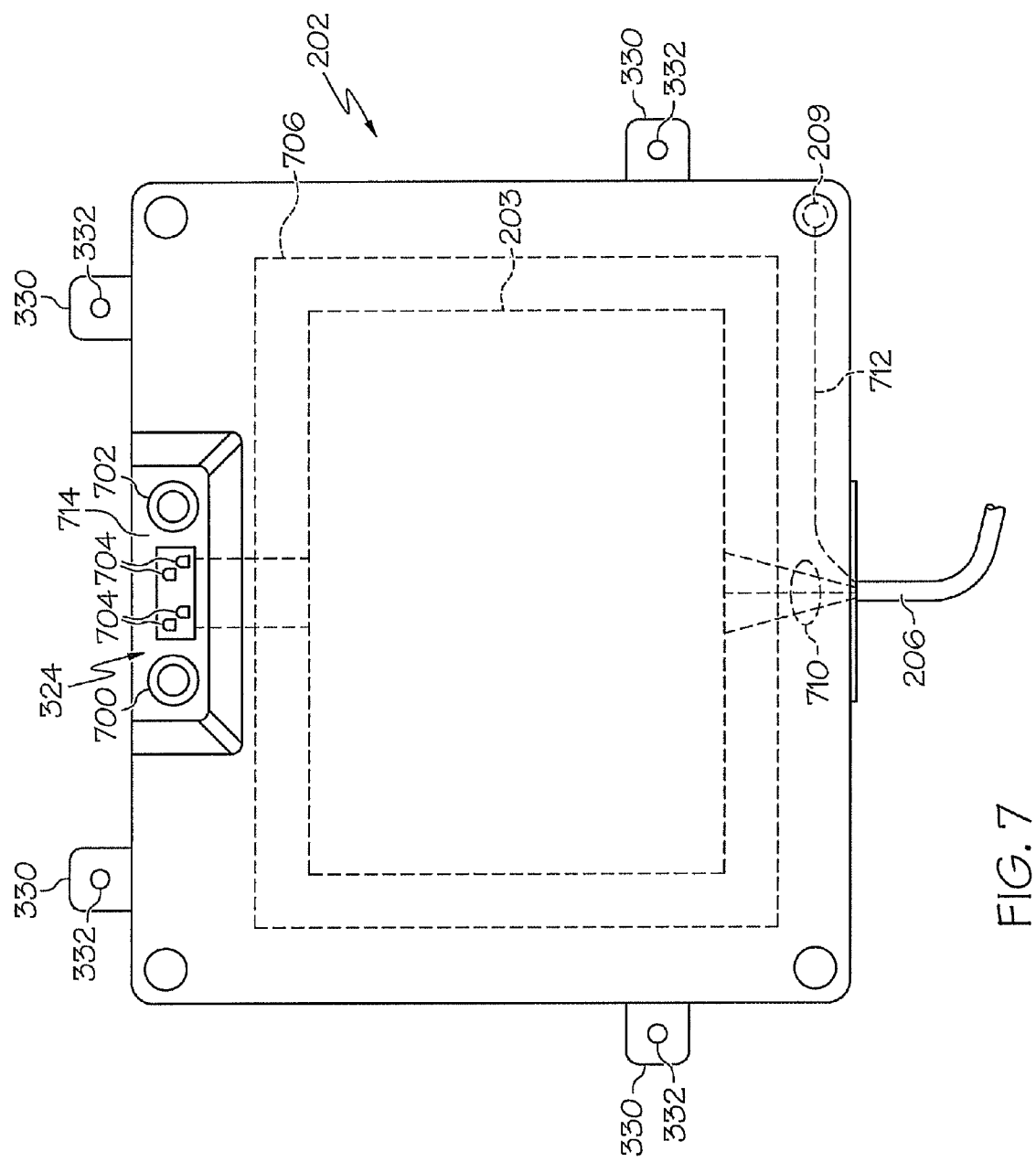
FIG. 7 is a plan view of an example inverter housing of the power inverter docking system of FIG. 2.

FIG. 7 is a plan view of the inverter housing 202. The inverter housing connector port 324 may include guide posts 700, 702. As discussed with regard to FIG. 5, the guide posts 700, 702 may be formed to be received by the guide post cavities 504, 505, respectively, when the connector ports 318, 324 are connected to one another. The inverter housing connector port 324 may also include a plurality of connector pins 704. The connector pins 704 may be electrically coupled to a PWB 706 (shown conceptually in phantom) internal to the inverter housing 202. The power inverter 203 may be electrically coupled to the PWB 706. The power inverter 203 may include a plurality of circuit elements arranged to convert DC power from the PV module 100 to AC power transmitted through the conductors 710 within the cable 206. The conductor 712 may serve as a grounding conductor and be coupled to a fastener 209. The conductors 710, 712 within the cable 206 may be connected to a number of other PV modules, a utility power grid, a stand-alone AC power load, or some combination of thereof.

The PV connector port 324 may include a connector plate 714 that includes the connector pins 704. The connector plate 714 may be removably coupled to the inverter housing 202 through one or more fasteners, such as fasteners 209 shown in FIG. 2.

Figure 8:
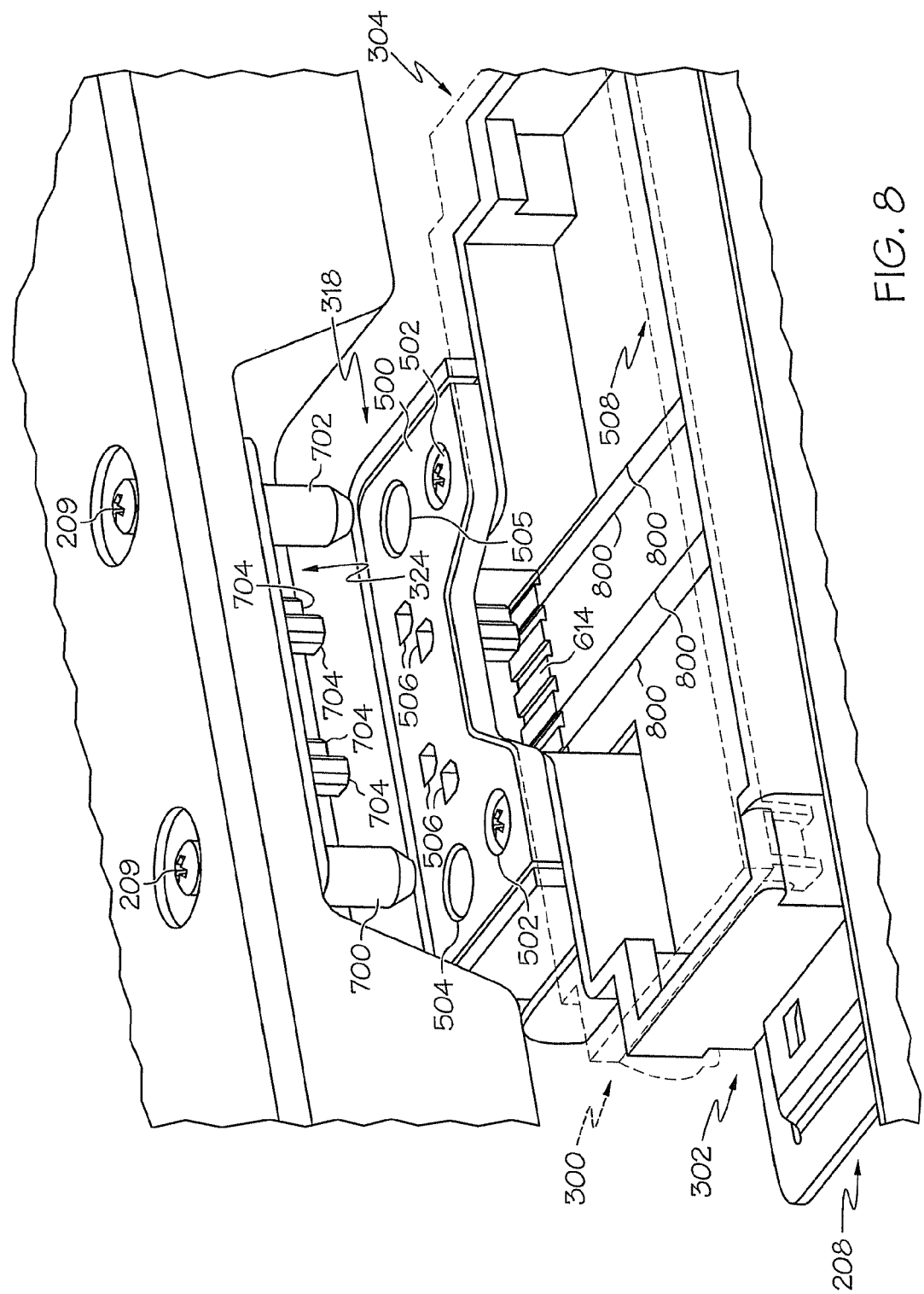
FIG. 8 is a perspective view of the junction box of FIG. 5 and the inverter housing of FIG. 7 prior to connection.

FIG. 8 is a perspective view of an example of the inverter housing connector port 318 prior to connection with the PV connector port 324. FIG. 8 provides an internal view of the enclosure 302. The PWB 508 may provide a surface for the conductors 800 to span for connection with the sockets 506. The sockets 506 may be mounted to the socket mounting board 614. The conductors 800 may be the connectors 322 of the PV module 100 or may be intervening conductors between the connectors 322 and the sockets 506. The connections between the connectors 322 and the sockets 506 may be made in various manners, such as crimping, soldering, or other manner of connection allowing electrical coupling of the sockets 506 to the connectors 322.

FIG. 8 also shows an example of the guide posts 700, 702 being connected to the inverter housing connector port 324 through fasteners 209 disposed through the inverter housing cover 205 of the inverter housing 202. In the example of FIG. 8, the guide posts 700, 702 may extend farther outwardly from the connector plate 714 than the connector pins 704 allowing receipt of the guide posts 700, 702 by the guide posts cavities 504, 505, respectively, to align the connector pins 704 with the sockets 506 prior to the connector pins 704 being received by the sockets 506.

FIGS. 9 and 10 are elevation views of an example alternative junction box 900 and example inverter housing 1000, respectively. The junction box 900 may be substantially similar to the junction box 204, except the junction box 900 may include a PV connector port 902 rotated substantially ninety degrees from the relative arrangement of the PV connector port 318. Similarly, the inverter housing 1000 may be substantially similar to the inverter housing 202 except the inverter housing 1000 may include an inverter housing connector port 1002 rotated substantially ninety degrees relative to the arrangement of the inverter housing connector port 324.

The arrangement of the connector ports 902, 1002 allows the inverter housing 1000 to approach the junction box 900 in a direction along, or along a plane substantially parallel to, the surface 214 of the PV module 100. The PV connector port 902 may include a connector plate 904 having a first guide post cavity 906 and second guide post cavity 908 formed therein. The connector plate 904 may also include a plurality of sockets 910 formed therein and configured to be electrically coupled to the PV module 100 in a manner similar to that described with regard to FIGS. 2-4.

The inverter housing connector port 1002 may include a connector plate 1004 having a first guide post 1006 and a second guide post 1008. The connector plate 1004 may also include a plurality of connector pins 1010. The connector pins 1010 may be configured to be received by the sockets 910 of the junction box 900 and the guide posts 1006, 1008 may each be received by a guide post cavity 906, 908, respectively, of the PV connector port 902.

Figure 11:
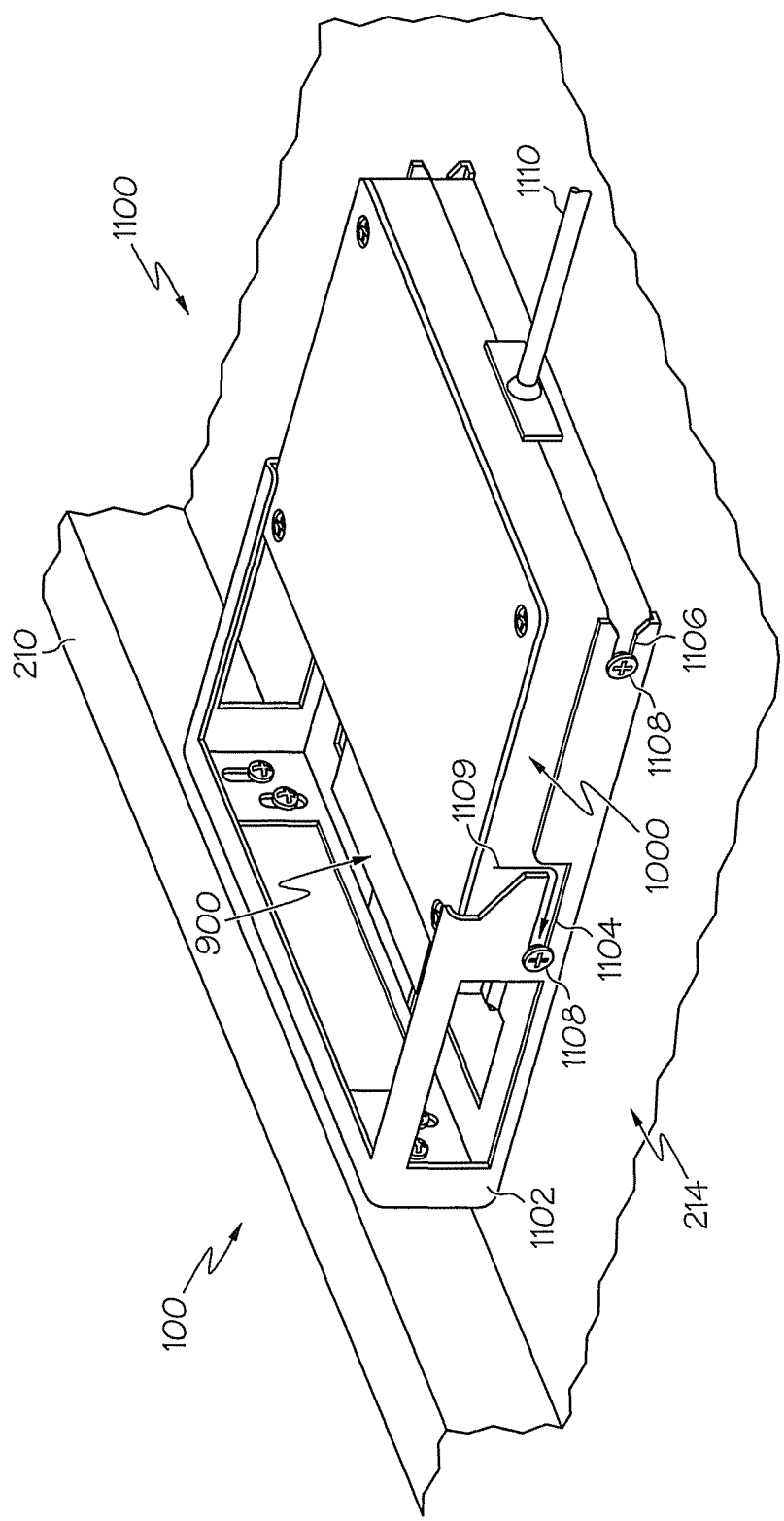
FIG. 11 is a perspective view of a photovoltaic module having an alternative power inverter docking system.

FIG. 11 is a perspective view of a docking system 1100 including the junction box 900 and the inverter housing 1000. FIG. 11 shows the PV connector port 902 coupled to the inverter housing connector port 1002. The docking system 1100 may include a docking member 1102 removably coupled to the rail 210 of the PV module 100. The junction box 900 may be removably coupled to the docking member 1102 in a manner similar to that described with regard to FIGS. 2-4. The docking member 1102 may include a plurality of front guides 1104 and back guides 1106. Each guide 1104, 1106 may be a slot formed to receive a fastener 1108. Each fastener 1108 may removable from the inverter housing 1000. Each fastener 1108 may be a threaded fastener such as a bolt or screw.

In coupling the junction box 900 and the inverter housing 1000, the inverter housing 1000 may be positioned such the fasteners 1108 corresponding to the front guides 1104 may enter the front guides 1104. The inverter housing 1000 may be slid toward the junction box 900 allowing the fasteners 1108 disposed in the front guides 1104 to move along the front guides 1104 and allowing the fasteners 1108 corresponding to back guides 1106 to be received by the back guides 1106. Arrow 1109 indicates the path of the fastener 1108 in the front guide 1104.

In the position shown in FIG. 11, the fasteners 1108 may be moved into the inverter housing 1102 allowing the docking member 1100 to be pressed between the fasteners 1108 and the inverter housing 1000 to secure the inverter housing 1000 into place. As the inverter housing 1000 is slid into the position shown in FIG. 11, the connector pins 1010 and guide posts 1006, 1008 of the inverter housing connector port 1002 may be received by the sockets 910 and the guide post openings 906, 908, respectively, electrically coupling the PV module 100 and a power inverter (not shown) housed by the inverter housing 1000. An electrical cable 1110 may internally include one or more conductors electrically coupled to the power inverter to transfer DC power generated by the PV module 100 to an AC load, similar to that described with regard to FIG. 7. In alternative configurations, the guides 1104, 1106 may be formed with a locking mechanism to clip the fasteners 1108 into place allowing the fasteners 1108 to be captured by the guides 1104, 1106, eliminating the need to press the docking member 1100 between the fasteners 1108 and the inverter housing 1000.

Figure 12:
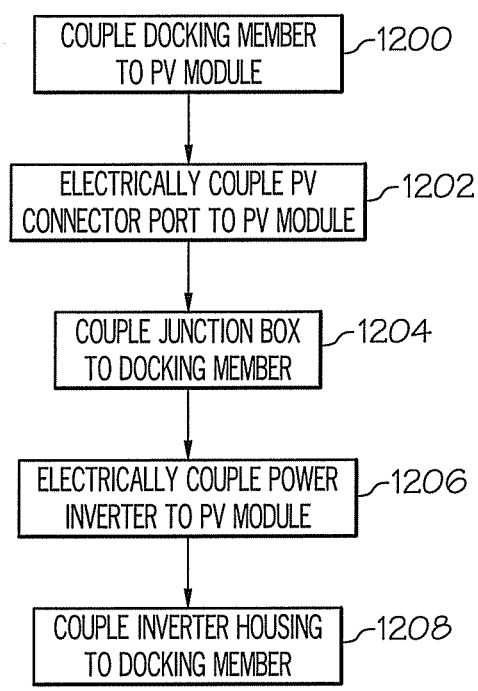
FIG. 12 is an example operational flow diagram for assembling a power inverter docking system for a photovoltaic module.

FIG. 12 is an example operational flow diagram for assembling a power inverter docking system of a PV module, such as the docking system 200. At block 1200, the docking member 208 may be coupled to the PV module 100. In one example, the docking member 208 may include a bracket 211 that may be removably or permanently fastened to the rail 210 of the PV module 100. The docking member 208 may also be removably or permanently coupled to the surface 214 of the PV module 100. In alternative examples, the docking member 208 may integrally formed with the PV module 100 eliminating the need to couple the docking member 208 to the PV module 100.

At block 1202, the PV connector port 318 may be electrically coupled to the PV module 100. In one example the PV connector port 318 may be electrically coupled to the connectors 322 of the PV module 100 allowing the connector port 318 to receive power generated by the PV module 100 based on solar energy received by the PV cells 102. In one example, the sockets 506 of the connector port 318 may be electrically coupled to the connectors 322.

At block 1204, the PV connector port 318 may be removably coupled to the docking member 208. In one example, the PV connector port 318 may be included in a junction box 204. The junction box 204 may be secured to the docking member 208 in a manner described with regard to FIGS. 2 and 3. At block 1206, the power inverter 203 may be electrically coupled to the PV module 100. In one example, the power inverter 203 may be housed by the inverter housing 202 that includes the inverter housing connector port 324. The inverter housing connector port 324 may be electrically coupled to the power inverter 203 as discussed with regard to FIGS. 2 and 7. The connector ports 318, 324 may be connected to one another to electrically couple the power inverter 203 to the PV module 100.

At block 1208, the inverter housing 202 may be coupled to the docking member 208. In one example, the inverter housing 202 may be coupled to the docking member 208 through aligning openings 332 in the docking tabs 330 with openings 328 in the docking arms 326 and disposing fasteners 220 through the aligned openings to removably couple the inverter housing 202 to the docking member 208. Alternative manners of assembling a docking system may be performed based on the operational flow diagram of FIG. 12, such the alternative configuration docking system 1100 described with regard to FIGS. 9-11. The operational flow diagram of FIG. 12 may include additional or fewer blocks than that described. Furthermore, the blocks of FIG. 12 may be arranged in an order alternative from that described.

While various embodiments of the innovation have been described, it will be apparent to those of ordinary skill in the art that many more embodiments and implementations are possible within the scope of the innovation. Accordingly, the innovation is not to be restricted except in light of the attached claims and their equivalents.

We claim:

1. A power inverter docking system for a photovoltaic module, the coupling system comprising:
   a first connector port configured to be electrically coupled to at least one photovoltaic cell of the photovoltaic module;
   a docking member configured to be removably coupled to the photovoltaic module, wherein the docking member is configured to be removably coupled to the first connector port, the docking member comprising a bracket configured to be selectively coupled to a rail of the photovoltaic module; and
   an inverter housing configured to be removably coupled to the photovoltaic module and configured to at least partially enclose a power inverter, the inverter housing including a second connector port electrically coupled to the power inverter, wherein the second connector port is configured to be selectively engageable to the first connector port and to be removably coupled to the photovoltaic module.

2. The power inverter docking system of claim 1, wherein the first connector port includes a plurality of sockets, wherein each of the plurality of sockets is configured to be electrically coupled to the at least one photovoltaic cell of the photovoltaic module.

3. The power inverter docking system of claim 2, wherein the second connector port includes a plurality of connector pins, wherein each of the plurality of sockets is configured to receive one of the plurality of connector pins, wherein receipt of the plurality of connector pins by the plurality of sockets electrically couples the power inverter to the at least one photovoltaic cell of the photovoltaic module.

4. The power inverter docking system of claim 3, wherein the second connector port includes at least one guide post, wherein the first connector port includes at least one guide post opening, wherein the at least one guide post opening is configured to receive the at least one guide post, and wherein at least partial receipt of the at least one guide post by the at least one guide post opening aligns each one of the plurality of connector pins with a respective one of the plurality of sockets.

5. The power inverter coupling system of claim 1 further comprising a junction box, wherein the junction box includes the first connector port, and wherein the junction box is configured to be removably coupled to the docking member.

6. The coupling system of claim 5, wherein the junction box includes at least one opening configured to be at least partially aligned with an opening of the photovoltaic module, where the opening of the photovoltaic module provides access to electrical connections of photovoltaic cells of the photovoltaic module.

7. The coupling system of claim 6, wherein the docking member includes at least one opening configured to be disposed between the junction box and the PV module, wherein the opening is configured to be at least partially aligned with the at least one opening of the docking member and the opening of the photovoltaic module.

8. The power inverter docking system of claim 1, wherein the docking member includes a plurality of docking arms, wherein each of the plurality of docking arms is configured to be removably coupled to the inverter housing to removably couple the inverter housing to the photovoltaic module.

9. The power inverter docking system of claim 8, wherein each of the plurality of docking arms includes an opening, and wherein the inverter housing includes a plurality of openings, wherein each opening of the inverter housing is configured to align with an opening of a respective one of the plurality of docking arms when the second connector port is selectively coupled to the first connector port.

10. The power inverter docking system of claim 8 further comprising a plurality of fasteners, wherein each fastener is configured to be disposed through a respective aligned opening of one of the plurality of docking tabs and the opening of the respective one of the plurality of docking arms.

11. The power inverter docking system of claim 1, wherein the docking member includes a plurality of guides, wherein the inverter housing includes a plurality of guide pins, wherein each of the plurality of guides is configured to receive one of the plurality of guide pins to removably couple the inverter housing to the docking member.

12. The power inverter docking system of claim 11, wherein the plurality of guide pins comprise a plurality of fasteners, wherein each of the plurality of fasteners is configured to secure a portion of the docking member between one of the plurality of fasteners and the inverter housing.

13. A photovoltaic module comprising:
    at least one photovoltaic cell positioned in a housing; and
    a docking system comprising:
      a junction box including a first connector port configured to be electrically coupled to the at least one photovoltaic cell, the junction box comprising at least one opening configured to be at least partially aligned with an opening of the housing that provides access to electrical connection of the at least one photovoltaic cell; and
    a housing configured to enclose at least a portion of a power electronics module, wherein the housing includes a second connector port configured to be electrically coupled to the power electronics module, wherein the second connector port is configured to removably engage the first connector port, wherein the power electronics module and the at least one photovoltaic cell are electrically coupled to one another when the second connector port is removably engaged to the first connector port, and wherein the housing is configured to be removably coupled to the photovoltaic module.

14. The photovoltaic module of claim 13, further comprising a docking member configured to be removably coupled to the photovoltaic module and configured to receive the housing, wherein the docking member is configured to be removably coupled to the housing upon receipt of the housing.

15. The photovoltaic module of claim 14, wherein the junction box is configured to be removably coupled to the docking member.

16. The photovoltaic module of claim 15, wherein the docking member is integrally formed with at least one of a surface and a rail of the photovoltaic module.

17. The photovoltaic module of claim 14, wherein the docking member is configured to be removably coupled to a rail of the photovoltaic module.

18. The photovoltaic module of claim 13, wherein the second connector port is integrally formed with the power electronics module.

19. The photovoltaic module of claim 13, wherein the power electronics module is a power inverter.

20. The photovoltaic module of claim 13, wherein the first connector port includes a plurality of sockets, wherein each of the plurality of sockets are electrically coupled to the at least one photovoltaic cell, wherein the second connector port includes a plurality of connector pins, wherein each of the connector pins is electrically coupled to the power electronics module, wherein each of the plurality of connector pins is configured to be received by a respective one of the plurality of sockets, and wherein the power electronics module is electrically coupled to the at least one photovoltaic cell when each of the plurality of connector pins is received by the respective one of the plurality of sockets.

21. A method of assembling a docking system for a photovoltaic module, the method comprising:
   electrically coupling a first connector port to at least one photovoltaic cell of the photovoltaic module;
   electrically coupling a first connector port with a second connector port, wherein the second connector port is electrically coupled to a power electronics module enclosed within a housing;
   selectively receiving the housing with a docking member of the photovoltaic module;
   removably coupling the housing to the docking member; and
   selectively coupling a bracket of the docking member to a rail of the photovoltaic module.

22. The method of claim 21, wherein the electrically coupling the first connector port with the second connector port comprises receiving each one of a plurality of connector pins of the first connector port with a respective one of a plurality of sockets of the second connector port.

23. The method of claim 21, wherein selectively receiving the housing with the docking member comprises aligning each of a plurality of openings of the docking member with a respective one of a plurality of openings of the housing, and wherein removably coupling the housing to the docking member comprises inserting a selectively removable fastener through each of the plurality of openings of the docking member and each aligned respective one of the plurality of openings.

24. The method of claim 21, wherein selectively receiving the housing with the docking member comprises receiving each of a plurality fasteners removably coupled to the housing with a respective guide of the docking member, and wherein removably coupling the housing to the docking member comprises securing a portion of the docking member between each one of the plurality of fasteners and the housing.

\* \* \* \* \*